United States Patent [19]
Domigan et al.

[11] Patent Number: 5,659,250
[45] Date of Patent: Aug. 19, 1997

[54] FULL BRICK CONSTRUCTION OF MAGNET ASSEMBLY HAVING A CENTRAL BORE

[75] Inventors: Paul Domigan; Mathew Arnold Hass, both of Andover, Mass.; Robert Gluckstern, Rockville, Md.

[73] Assignee: Intermagnetics General Corporation, Latham, N.Y.

[21] Appl. No.: 616,488

[22] Filed: Mar. 19, 1996

[51] Int. Cl.$^6$ .................................................. G01V 3/00
[52] U.S. Cl. ............................................ 324/320; 324/319
[58] Field of Search .................................... 324/318, 319, 324/320, 321, 322; 335/296, 297, 302

[56] References Cited

U.S. PATENT DOCUMENTS

| | | | |
|---|---|---|---|
| 4,538,130 | 8/1985 | Gluckstern et al. | 324/319 |
| 4,580,098 | 4/1986 | Gluckstern | 324/307 |
| 4,614,930 | 9/1986 | Hickey et al. | 335/302 |
| 4,698,611 | 10/1987 | Vermilyea | 335/298 |
| 4,771,244 | 9/1988 | Vermilyea | 324/320 |
| 4,853,663 | 8/1989 | Vermilyea | 335/301 |
| 4,931,760 | 6/1990 | Yamaguchi et al. | 335/306 |
| 5,148,138 | 9/1992 | Miyata | 335/302 |
| 5,319,339 | 6/1994 | Leupold | 335/302 |

OTHER PUBLICATIONS

"REC Quadrupoles And Dipoles With Circular And Elliptical Cross Sections" R.L. Gluckstern and R.F. Holsinger (Proceedings of the 1983 Particle Accelerator Conference p. 3623).

*Primary Examiner*—Louis M. Arana
*Attorney, Agent, or Firm*—Helfgott & Karas, P.C.

[57] ABSTRACT

A permanent magnet assembly having a central elliptical bore, suitable for reception of a patient in an MRI system, is formed of a plurality of elliptically shaped sections disposed along an axis of the bore. Each section is subdivided into a plurality of segments in which each segment is constructed of bricks of magnetic material. Each brick has the shape of a right parallel piped. In any one of the segments, all of the bricks are arranged parallel to a common plane which is parallel to the bore axis. The bricks are magnetized with magnetization vector oriented in a common direction perpendicular to the plane. Full bricks are employed throughout all of the segments with the exception of a plurality of bricks along a surface of the bore wherein truncation of one or more of the bricks may be required to attain a desired homogeneity to a dipole magnetic field within the field. Directions of magnetization of the various segments vary in a symmetrical pattern about the bore to attain the desired field within the bore while minimizing any magnetic field outside of the assembly. This reduces overall weight of the assembly, and reduces the manufacturing cost.

19 Claims, 13 Drawing Sheets

FULL BRICK CONSTRUCTION OF MAGNET ASSEMBLY HAVING A CENTRAL BORE

BACKGROUND OF THE INVENTION

This invention relates to the construction of a magnet assembly having a central bore suitable for reception of a patient, as in a magnetic resonance imaging (MRI) system, wherein the assembly comprises an array of coaxial segmented ellipses of which each segment is fabricated of a mosaic of bricks of magnetic material. The magnetization vector orientation in the ellipses is determined in a unique fashion to minimize external field and provide homogeneous center field. To reduce overall weight of magnetic material, each section has an elliptical shape, and full uncut bricks are employed throughout each segment with the exception of the segment surface facing the bore due to a truncation of one or more of the bricks to obtain a desired homogeneity of the magnetic field in the bore.

MRI systems are widely used today. A characteristic feature in the construction of such a system is the use of a large permanent magnet assembly which encloses a central cylindrical bore. Typically, the bore has a circular cross section of sufficient diameter to receive a patient, and the magnet assembly provides a homogeneous field within the bore as is required for the production of magnetic resonance images. An example of such construction of the magnet assembly is taught in Gluckstern et al, U.S. Pat. No 4,580,098, wherein the assembly is composed of a set of circular ring dipole sections which, in turn, are subdivided into segments composed of bricks of magnetic material. In order to provide the desired configuration to each segment, and for providing the desired strength and distribution of magnetic field, the bricks in peripheral regions of a segment are cut, as by a taper, to provide a smooth edge surface. In addition, each segment is totally filled with the bricks.

Such a configuration of magnet assembly is relatively large and heavy as compared to other types of imaging instruments. The large mass of magnetic material is disadvantageous, not only from a point of view of transportation and assembly, but also from a point of view of cost. In addition, the tapering of the bricks is disadvantageous in the sense that the tapering entails additional manufacturing procedures and, hence cost.

SUMMARY OF THE INVENTION

The aforementioned disadvantages are overcome and other benefits are provided by a form of construction of the magnet assembly wherein, instead of the circular cross-section of the bore, the invention provides for an elliptical cross-sectional configuration of the bore. The elliptical cross-section introduces a greater efficiency for production of the magnetic field because the cross section of the bore more closely matches the subject, namely the patient, to be imaged. Thus, there is less wastage of magnetic field which would otherwise have to be produced. In addition, the use of the elliptical cross-sectional applies to the entire configuration of the magnet assembly which results in a reduction in the total mass of magnetic material employed in the assembly.

A further feature of the invention is the construction of the magnet assembly of a plurality of elliptically shaped sections of magnetic material (as distinguished from the circular ring shaped sections of magnetic material of the prior art), wherein each section is formed of a plurality of segments constructed of bricks of magnetic material. By way of example, an elliptical section of 12 segments is employed in a preferred embodiment of the invention. With the exception of a relatively small number of blocks disposed along a surface of the bore, all of the blocks of magnetic material used in constructing the segments are full blocks without any tapering, cutting or truncation to enable the blocks to fit a specific configuration of perimeter. Indeed, the invention s operative with a jagged perimeter surrounding the various segments with the foregoing exception, wherein one or more of the bricks facing the bore may have to be truncated to establish the desired homogeneity of magnetic field within the bore. Additionally, it has been found in the practice of the invention, that it is not necessary to completely fill each segment with magnetic material, and that the desired strength and distribution of the magnetic field can be attained even with the presence of voids between various ones of the bricks in each of the segments. This reduces the overall weight of the magnet assembly. In addition, the reduced need for trimming the blocks greatly facilitates manufacture.

In order to accomplish the foregoing construction of the magnet assembly, the bricks in each of the segments are aligned in accordance with a principle plane in each of the segments wherein the plane is perpendicular to the direction of the magnetization vector. The principle plane is parallel to the bore axis. In the various segments, the principle planes are oriented in different directions and, similarly, the magnetization vectors are oriented in different directions. The invention employs a dipole configuration of magnetic field within the bore and, accordingly, the directions of magnetization within the various segments of each elliptically shaped section are established in accordance with an arrangement of the respective contributory magnetic fields of the segments to produce the dipole field configuration within the bore while minimizing the strength of the magnetic field exteriorly of the magnet assembly.

The arrangement of the magnetization vectors of the respective segments may be explained with respect to the following geometric construction wherein, for any one of the elliptically shaped sections, the ellipse of the bore is described by a major axis and a minor axis. The two axes intersect at a central point of the bore, and define quadrants of the elliptically shaped section. In the case of the preferred embodiment employing 12 segments in each section, each quadrant has three segments wherein a central one of the segments is nested between a first segment adjacent the minor axis and the second segment adjacent the major axis. In each of the central segments of the respective quadrants, the direction of magnetization is nearly parallel to the minor axis. With respect to the segment lying adjacent to the minor axis, the direction of magnetization is approximately transverse to a radius vector extending from the central point. With respect to the segment lying adjacent to the major axis, the direction of magnetization is approximately parallel to the radius vector but inclined slightly thereto. This produces a symmetry in the direction of the magnetic fields and also in the configurations of the respective segments. Thus, there is symmetry between diametrically opposed segments. Also, the group of segments disposed on one side of the major axis is symmetrical with respect to the group of segments disposed on the opposite side of the major axis, and similarly there is symmetry between the group of segments disposed on one side of the minor axis with the group of segments on the opposite side of the minor axis. The resulting construction of the magnet assembly provides for the benefits of reduced weight, reduction of the magnetic field outside of the assembly, simplicity of manufacture, and reduction of cost.

BRIEF DESCRIPTION OF THE DRAWING

The aforementioned aspects and other features of the invention are explained in the following description, taken in connection with the accompanying drawing figures wherein.

Identically labeled elements appearing in different ones of the figures refer to the same element in the different figures but may not be referenced in the description for all figures.

DETAILED DESCRIPTION

Figure 1:
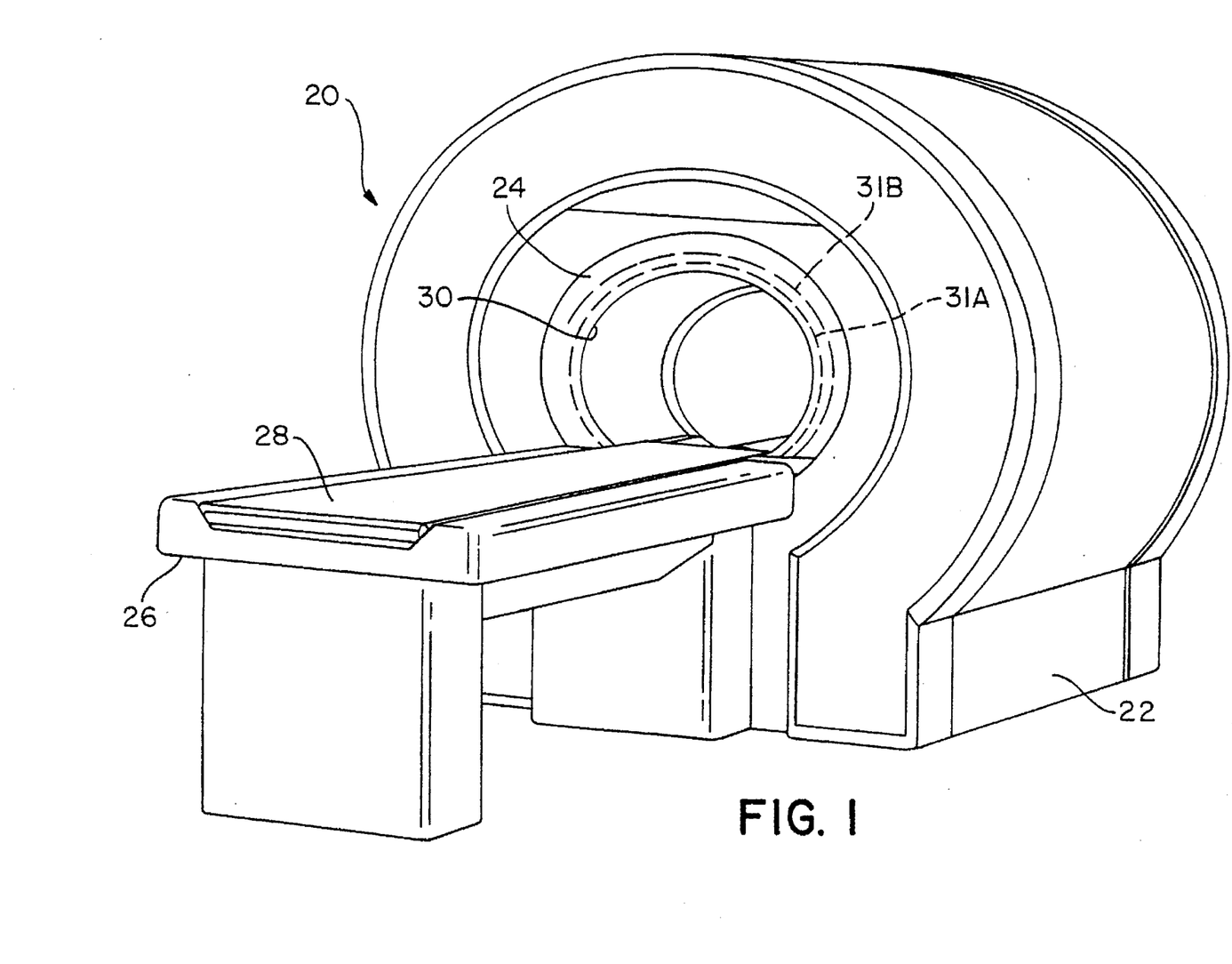
FIG. 1 is a stylized perspective view of an MRI system employing a magnet assembly having an ellipsoidal section with ellipsoidal bore for receiving a patient, the magnet assembly being constructed in accordance with the invention.

FIG. 1 shows an MRI system 20 comprising a housing 22 which encloses and supports a magnet assembly 24. Extending from the front end of the housing 22 is a table 26 having a movable platform 28 thereon. Translation of the platform 28 carries a patient (not shown) to the interior of a central bore 30 of the magnet assembly 24, whereupon the system 20 becomes operative for producing an image of subject matter within the patient. Included within the system 20 are well-known excitation coils 31A and gradient coils 31B, indicated in phantom, which cooperate with the magnet assembly 24 to produce desired fields within the patient receiving bore 30 to obtain a desired image.

In accordance with a feature of the invention, the bore 30 is provided with an elliptical cross-section which more nearly matches the cross-section of the patient than would a circularly shaped bore (not shown in FIG. 1). Therefore, use of the elliptical bore 30 of the invention provides for a more efficient utilization of the magnetic field produced by the magnet assembly 24 within the bore 30 because nearly all of the cross-sectional area of the bore 30 is utilized in developing the image. As a further feature of the invention, the magnet assembly 24 produces a dipole magnetic field which extends horizontally across the major axis of the elliptical bore 30. A theoretical discussion of the development of a magnetic field within an elliptically shaped bore is discussed in an article entitled "REC Quadrupoles and Dipoles with Circular and Elliptical Cross-sections" by R. L. Gluckstern and R. F. Holsinger appearing in the Proceedings of the 1983 Particle Accelerator Conference, beginning at page 3623. Therein, the description of the magnetic field is given in terms of a quadrupole rather than the dipole employed in the magnet assembly 24. Also, in the Gluckstern and Holsinger article, the particular magnet segments do not make use of the complete exterior elliptical shape of the magnet assembly. In addition, the Gluckstern and Holsinger article does not discuss a zeroing of the magnetic field exteriorly of the magnet, nor does this article provide a uniform three-dimensional volume, the article being restricted to two dimensions. Also, in the Gluckstern and Holsinger article, the two-dimensional construction for magnetic dipole differs from the construction for a circular cross section employed in other MRI magnets. In contrast, the magnet assembly 24, in a preferred embodiment of the invention, provides for an elliptical permanent magnet formed of individual sections with each section being of elliptical dipole magnet type. The result of this construction of magnet provides a homogeneous internal field within the bore 30, and provides for a cancellation of magnetic fields beyond the exterior of the perimeter of the elliptical magnet assembly 24.

Figure 2A:
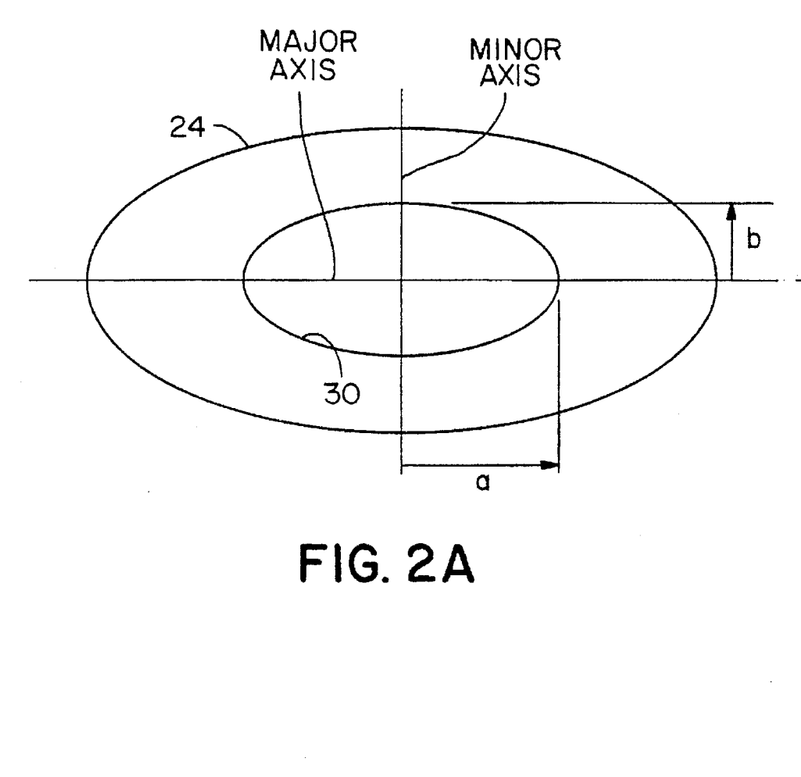
FIGS. 2A and 2B show comparison between cross-sectional areas respectively of an elliptically shaped magnet section and a circularly shaped magnet section.
Figure 2B:
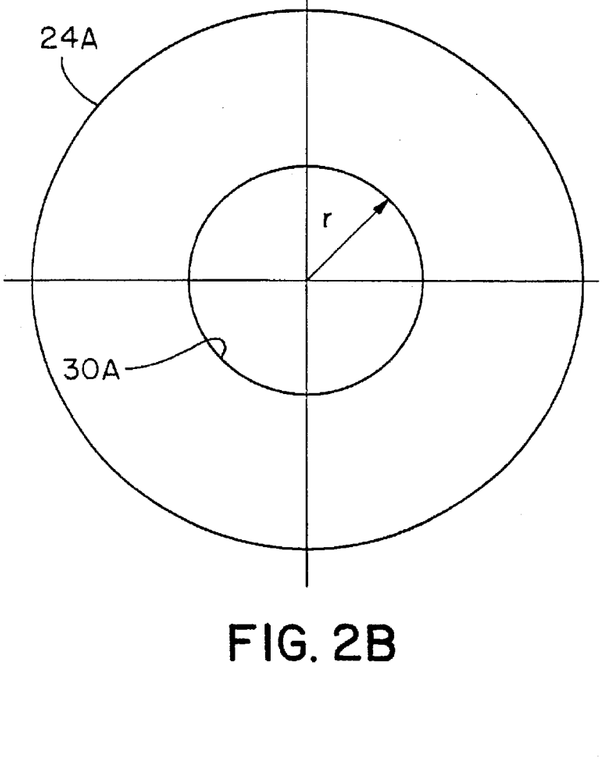

FIGS. 2A and 2B demonstrate the efficiency in production of a magnet bore cross-sectional area by use of an elliptically shaped bore as compared to a circularly shaped bore. FIG. 2A shows the end view of the magnet assembly 24 with its bore 30. The ellipse of the bore cross section is described in terms of a major axis and a minor axis identified in FIG. 2A. The major axis has a length $2a$, and the minor axis has a length $2b$. By way of contrast, FIG. 2B shows a magnet assembly 24A of circular cross-section and having a central bore 30A of circular cross section and radius r. It is readily appreciated by inspection of the two FIGS. 2A and 2B that for a volume of magnet material which is approximately equal in the two assemblies 24 and 24A, the bore 30 of elliptical cross-section has far more useful area than does the bore 30A of circular cross-section. This result is obtained because the elliptical shape of the bore 30 more closely resembles the oval cross section of a human being that does the circular configuration of the bore 30A.

Figure 3:
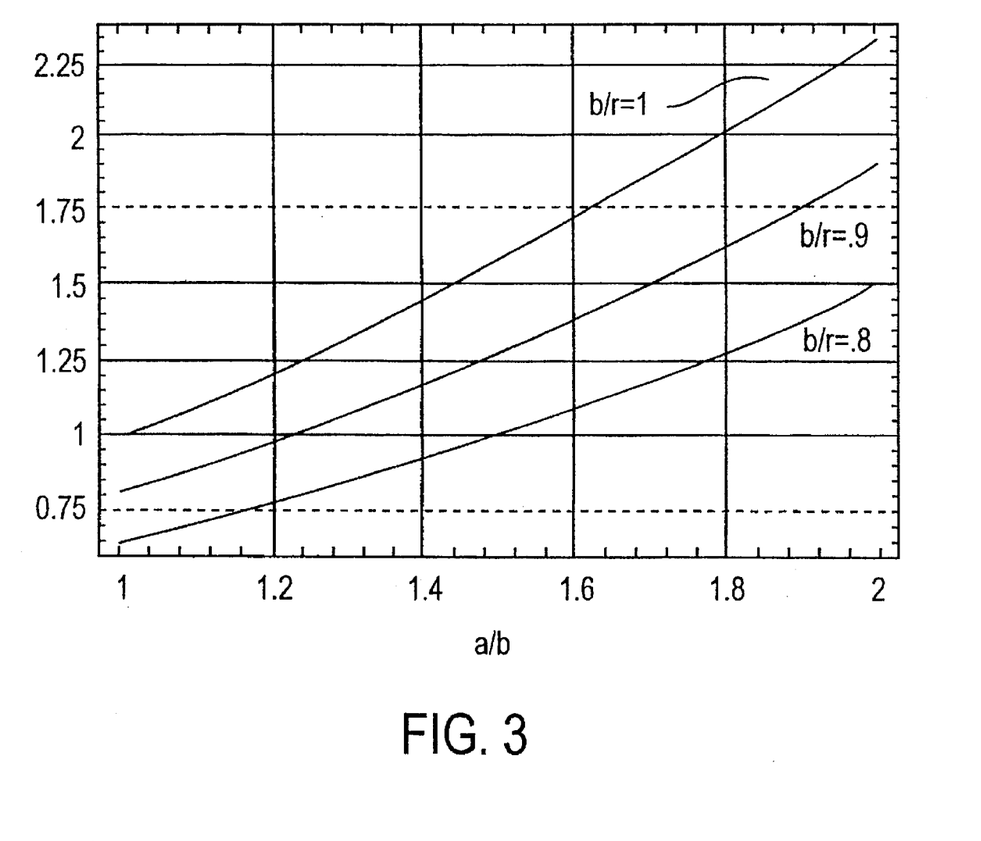
FIG. 3 is a graph showing the ratio of weight of an elliptically shaped magnet section to a magnet section in the shape of a circular ring.

FIG. 3 shows relationships between elliptically shaped assemblies such as that of FIG. 2A and circularly shaped magnet assemblies such as that of FIG. 2B. Along the horizontal axis of the graph in FIG. 3, there is presented the ratio of the major axis to the minor axis of the bore 30 of FIG. 2A. Three separate traces are presented for three different ratios of the minor axis of the bore 30 to the radius of the bore 30A. The vertical axis of FIG. 3 shows the resulting ratio of the weight of the elliptical magnet assembly 24 to the circular magnet assembly 24A. In particular, it is noted, by way of example, that for a minor axis of the elliptical bore being only 80% of the diameter of the circular bore, the ellipse can have a major axis which is 50% longer than the minor axis while having equality of weight of the two magnet assemblies. This clearly demonstrates the efficiency in use of the elliptical cross-section as compared to the circular cross-section of a magnet assembly.

Figure 4:
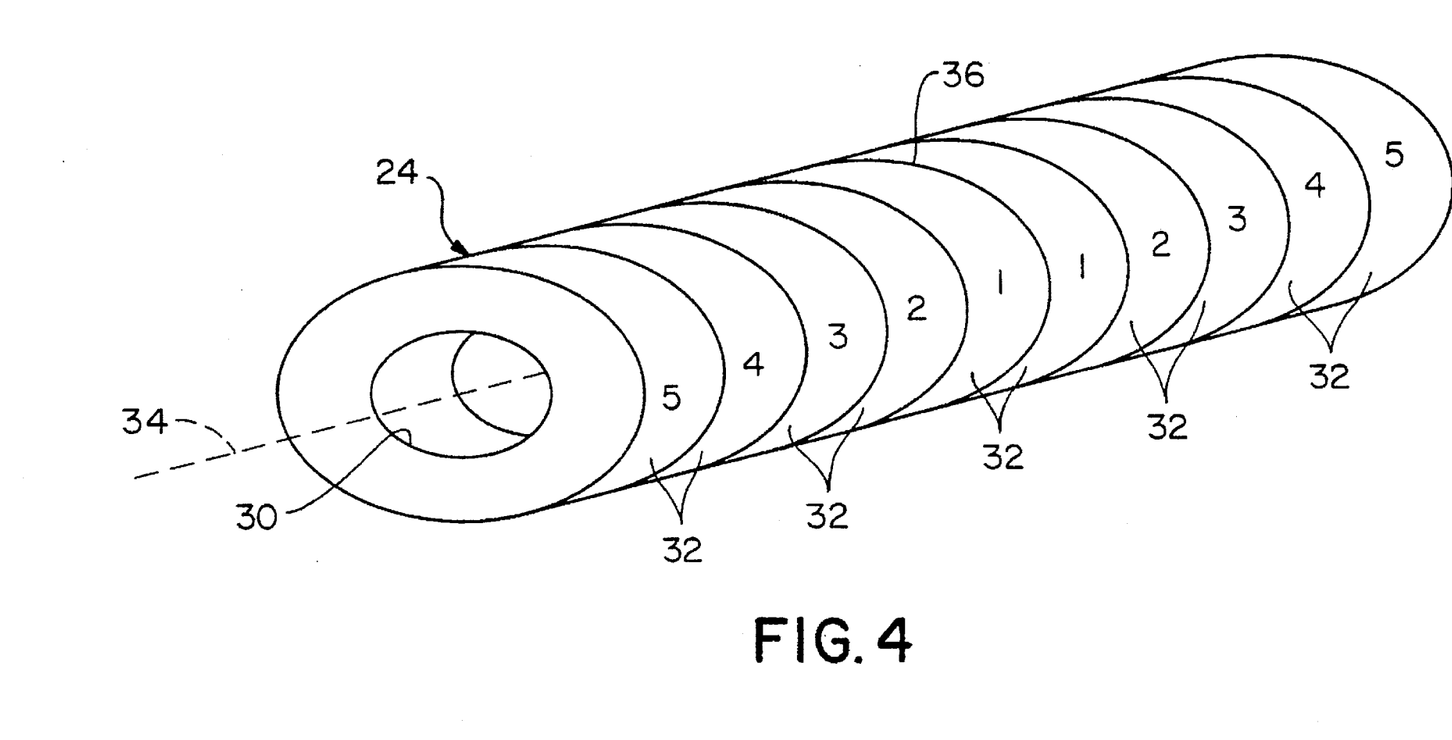
FIG. 4 is a stylized view of the magnet assembly of FIG. 1 showing two sets of elliptical ring sections disposed along a bore axis symmetrically about a central plane wherein each of the sets is composed of five elliptically shaped sections.

FIG. 4 shows the construction of the magnet assembly 24 wherein the magnet assembly 24 comprises a series of elliptically shaped ring sections 32 disposed coaxially along a central axis 34 of the bore 30, the sections 32 being located contiguous each other. In the preferred embodiment of the invention, the magnet assembly 24 is provided with ten of the sections 32. The sections 32 are arranged symmetrically about a central plane 36 oriented normally to the bore axis 34 and extending through the middle of the assembly 24. The central plane 36 divides the ten sections 32 into two sets of five sections 32. Individual ones of the sections 32 are further identified by the legends 1, 2, 3, 4 and 5, wherein the inboard sections contiguous the central plane 36 are identified by the numeral 1, and the outboard sections 32 are identified by the numeral 5. The two sections 32 identified by the numeral 1 are of identical construction, and similarly, in each of the pairs of sections 32 identified respectively by the numerals 2, 3, 4, and 5, the two sections are identical in construction.

Figure 5:
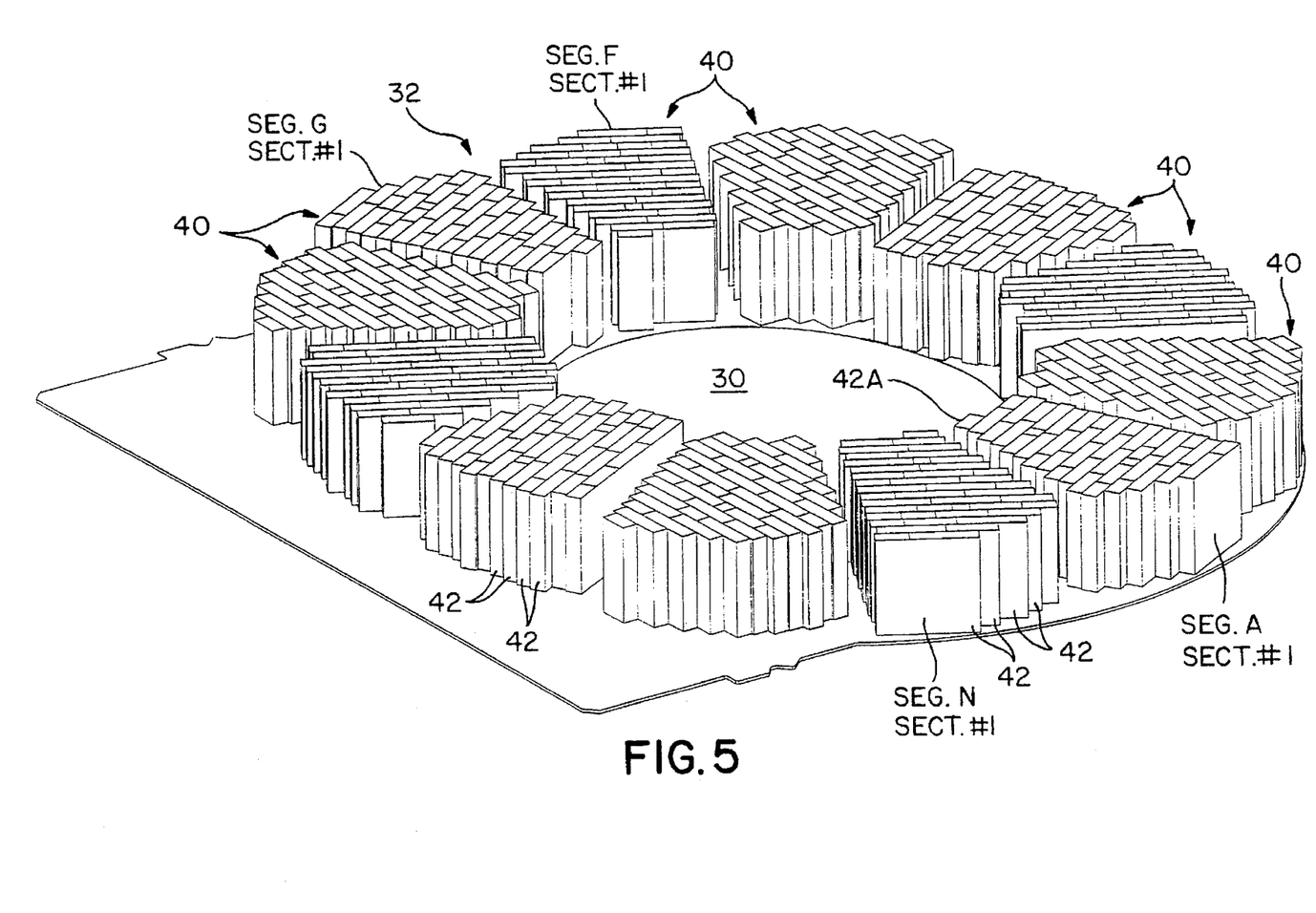
FIG. 5 is shows a stylized view of a single elliptical section in the center of the magnet assembly of the invention, the view being simplified by deletion of nonmagnetic support material from between the segments of the elliptical section to facilitate a viewing of the bricks of magnetic material.

FIG. 5 shows details in the construction of one of the sections 32 of FIG. 4. While the description of FIG. 4 applies specifically to a central section 32 of FIG. 4, namely a section #1, the same form of construction applies generally to all of the other sections 32 of FIG. 4. In the construction of any one of the sections 32, it is to be understood that the magnetic material is supported by frame elements disposed between the segments of a section and developing the sections, as has been disclosed in the aforementioned Gluckstern patent 4,580,098. However, in order to facilitate the description of the arrangement of the magnetic material in the section 32 of FIG. 5, a supporting frame 38 for the magnetic material is shown partially with elements of the frame 38 having been deleted except for a portion, in the shape of a partition, located between the section 32 and a contiguous section shown in FIG. 4. With reference to FIG. 5, the section 32 comprises twelve segments 40 each of which comprises a multiplicity of bricks 42 of magnetic material such as strontium ferrite, samarium cobalt, neodymium boron iron, or other such high remanence magnetic material suitable for construction of permanent magnets. Each brick has the shape of a right parallelpiped with rectangular faces wherein an end face may be square or rectangular. The partition 38 is constructed as a fiberglass plate connecting with the bricks 42, the latter being held together by an adhesive such as is disclosed in the aforementioned Gluckstern patent 4,580,098.

Figure 6:
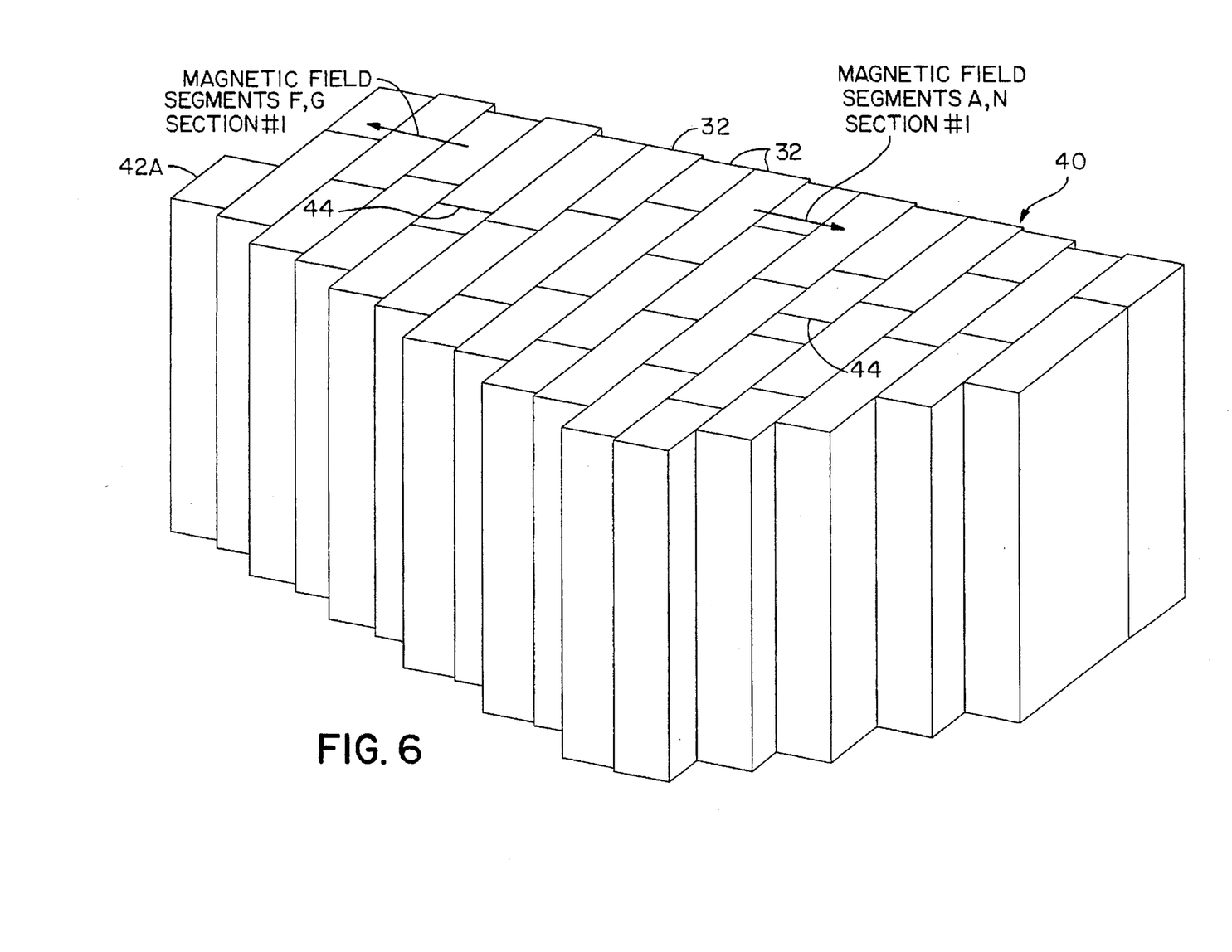
FIG. 6 is an enlarged view of one of the segments of FIG. 5.

As shown in FIGS. 5 and 6, the bricks 42 are arranged contiguous each other in any one of the segments 40, and are portrayed as standing upon the partition 38 with their end surfaces in contact with the partition 38. The bricks 42 are each constructed of a standard size of brick of which there are three standard sizes. All three sizes employ the same length of brick, namely a length of six inches. In all three sizes, the bricks 42 have a common thickness or height dimension of one inch. However, the sizes differ with respect to the width dimension of a brick 42. The smallest size brick has a width of one inch which provides for a square end surface of the brick 42. The next larger size of brick has a width of two inches which provides for a rectangularly shaped end surface to the brick. In the largest size of brick, the width dimension is four inches. In accordance with a feature of the invention, all of the bricks employed in the construction of the elliptical section 32 are full-sized bricks drawn from the foregoing three sizes of brick, with the possible exception of some of the bricks 42 which face into the bore 30 wherein a cutting of the bricks to a nonstandard size may be required in order to attain the desired homogeneity of magnetic field within the bore 30. This greatly facilitates manufacture by avoiding the necessity of an extra manufacturing step in the shaping of numerous bricks of the section of the magnet assembly, as would be required in the absence of the invention.

Figure 9:
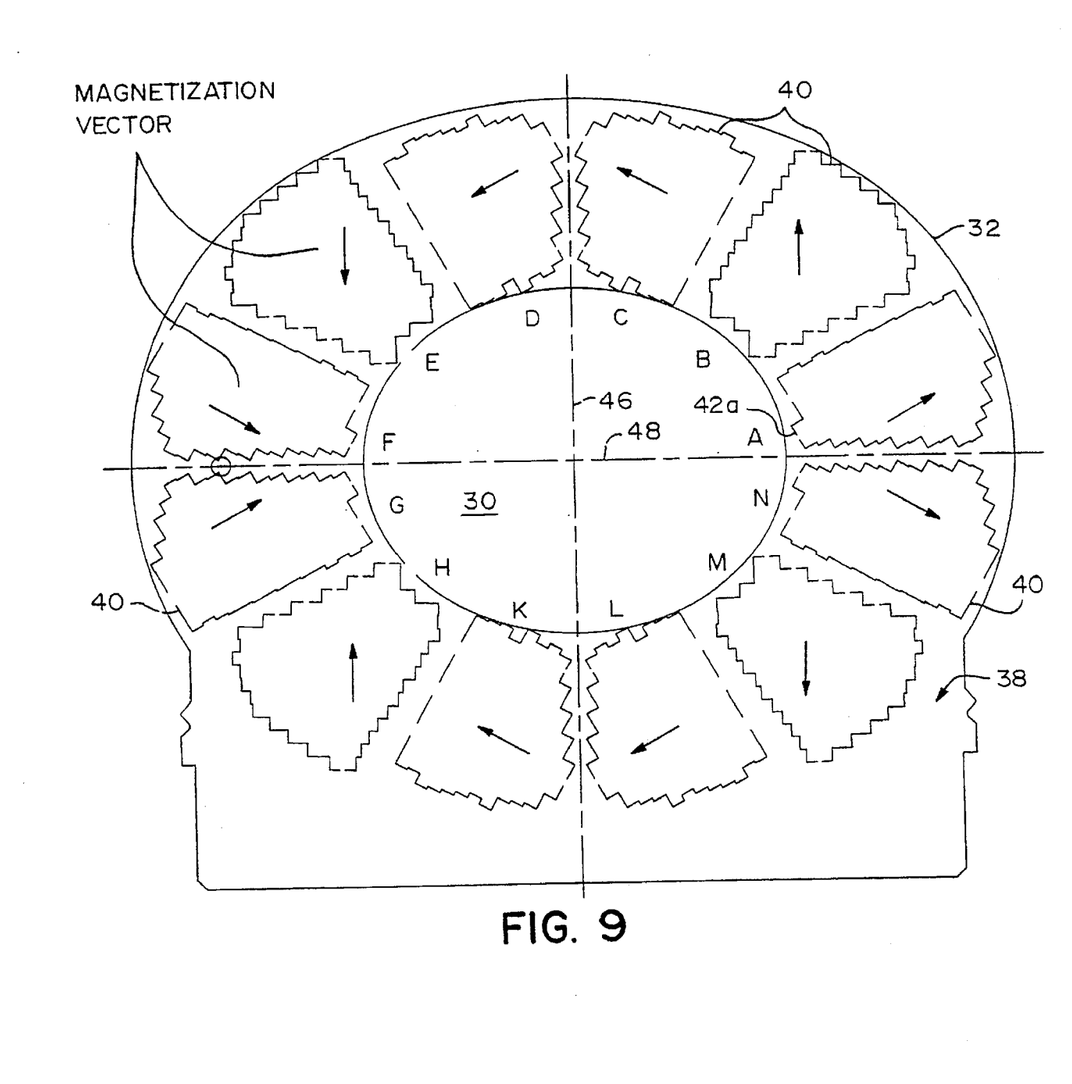
FIG. 9 shows an end view of the first elliptical ring section of one of the sets of FIG. 4 including a diagrammatic showing of the periphery of each segment and the directions of magnetic fields portrayed by vectors in respective ones of the segments.
Figure 10:
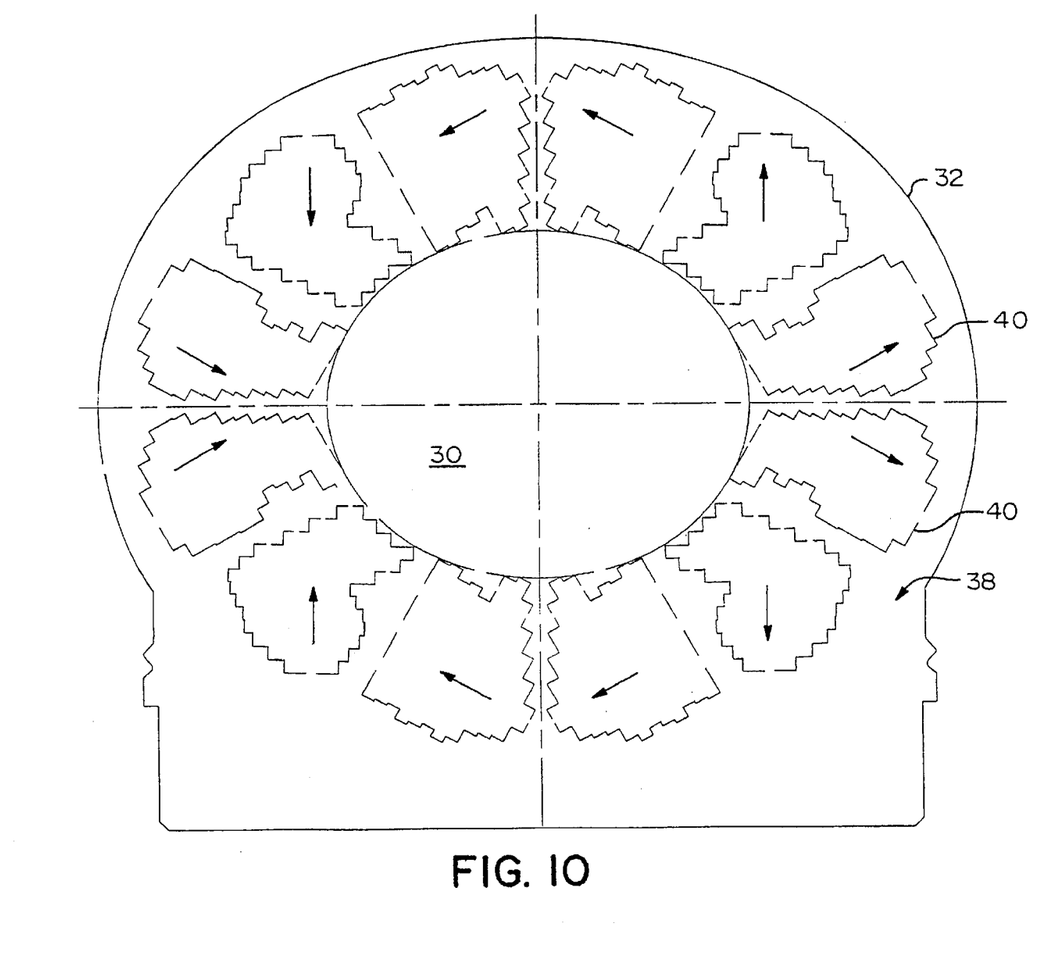
FIGS. 10–13 show stylized views, similar to that of FIG. 9, for each of the sections 2–5, respectively, of the sets of the elliptical ring sections of FIG. 4.
Figure 11:
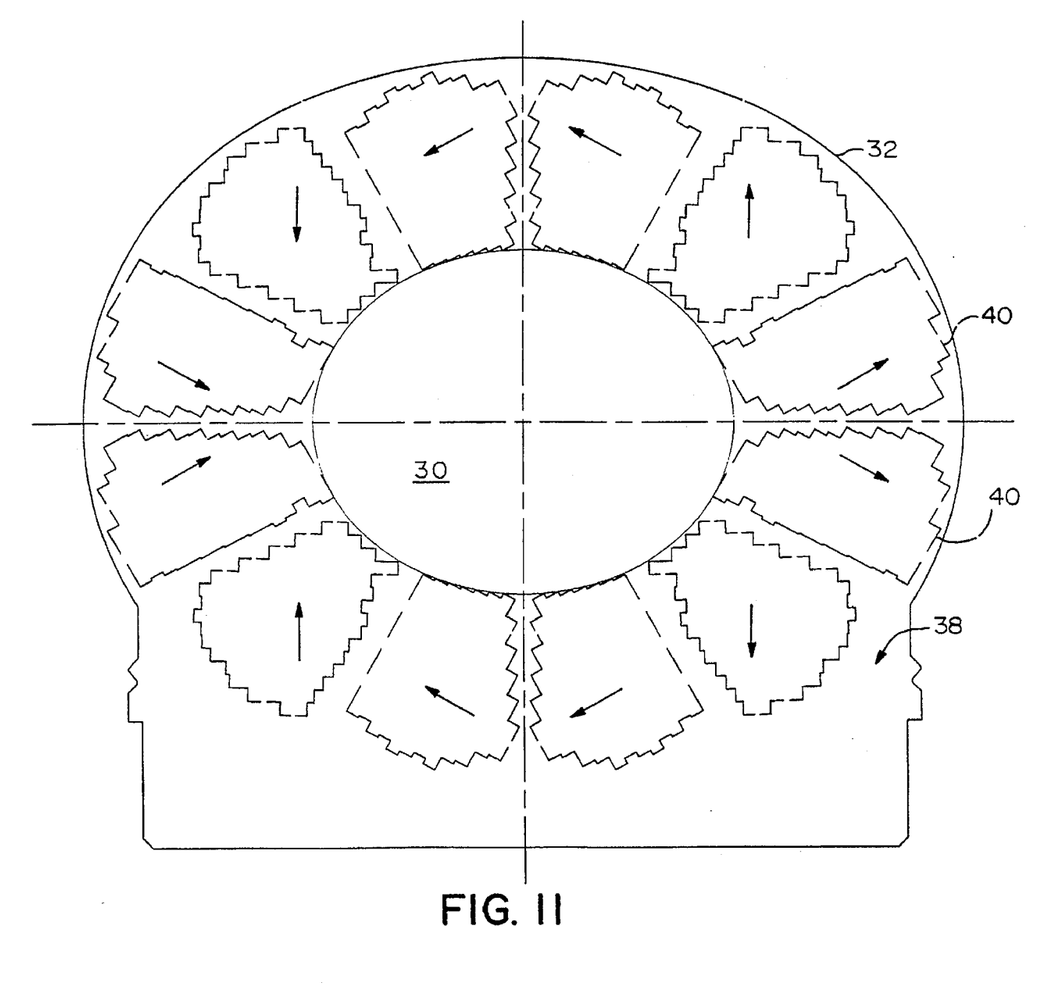
Figure 12:
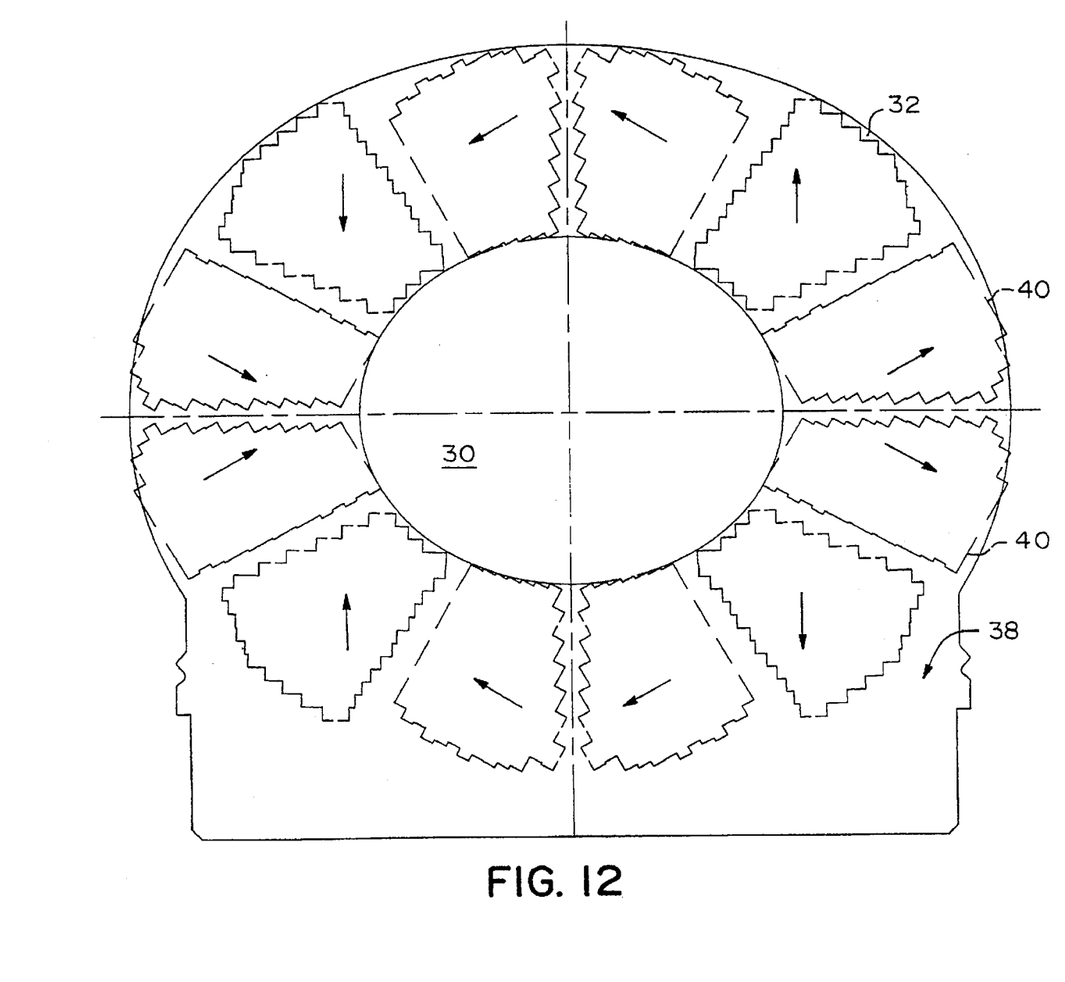
Figure 13:
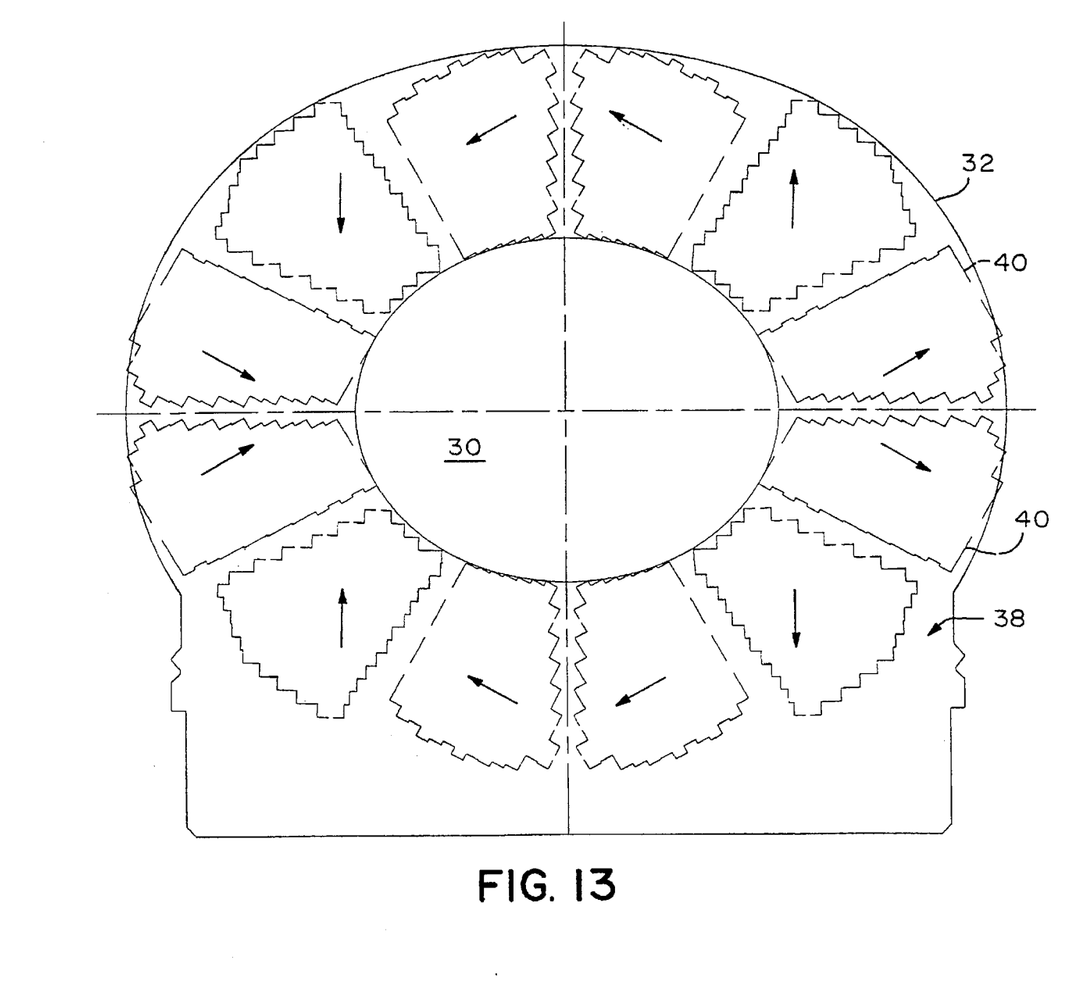

It is useful to compare FIGS. 5 and 6 with FIG. 9 for facilitating understanding of the construction of the various sections 32 of the magnet assembly 24 of FIG. 4. As will be described hereinafter in further detail, FIG. 9 shows the arrangement of the segments 40 within a section 32, specifically a section #1 as identified in FIG. 4. In FIG. 9, the twelve segments are identified by the legends A, B, C, D, E, F, G, H, K, L, M and N. The segments A, F, G, and N have the same physical configuration. Also, the magnetization vectors, as shown in FIG. 9, have the same directions relative to the arrangement of bricks 42 in each of the four segments A, N, F, and G except that the sense of the vector is reversed in the segments F and G as compared to the sense of the vectors in the segments A and N. The enlarged view of the segment 40 portrayed in FIG. 6 discloses the arrangement of the bricks 42 in any one of the segments A, F, G, and N, specifically for a section #1 identified in FIG. 4. The broad sides of the wide bricks 42 of a segment 40 are parallel to a common plane which may be referred to as the principle plane of the segment 40. Within any one of the segments 40, the orientation of the magnetization vector is perpendicular to the principle plane.

The arrangement of the bricks 42 in the segments 40, as depicted in FIG. 5, corresponds to the section #1 depicted in FIG. 9. Also identified in FIG. 5 are the segments A, F, G, and N of section #1. The magnetization vectors depicted in the segments A, N, F, and G of FIG. 9 are shown also in FIG. 6. The sense of the magnetization for the segments A and N is opposite to the sense of the magnetization for the segments F and G as indicated for the segment 40 portrayed in FIG. 6. Thus, in FIG. 9, the magnetization of segments A and N are directed in a generally radially outward direction, while, in the segments F and G, the magnetic fields are directed generally radially inwardly. As shown in FIG. 5, the orientations of the broad sides of the bricks 42 are varied among the segments 40 so as to provide the various orientations of the magnetization vectors designated in FIG. 9.

As may be seenby the jagged edges of the segments 40, as shown in FIGS. 5 and 6, the invention recognizes that the homogeneity of the magnetic field in the bore 30 can be obtained even with jagged edge regions of the segments 40, and that smooth edged regions of such segments are not required. Furthermore, within each of the segments 40, it is not necessary to completely fill the segment 40 with magnetic material, and that voids, such as the voids 44 of FIG. 6, may be provided among the bricks 32. This produces a cost savings in terms of reduced amount of magnetic material, and also reduces the overall weight of a segment 40, and is used also to provide the required homogeneity of magnetic field. If desired, the void 44 may be filled with a nonmagnetic material such as fiberglass, by way of example, such filled voids 44 being depicted in FIG. 6. In FIG. 6, one of the bricks identified as the brick 42A has an overall width which has been reduced from the two-inch width as may be seen by inspection of FIG. 6. The brick 42A, also identified in FIGS. 5, and 9 faces the bore 30 and a specific tailoring of the brick's shape is useful in attaining a desired homogeneity to the magnetic field within the bore 30.

Figure 7:
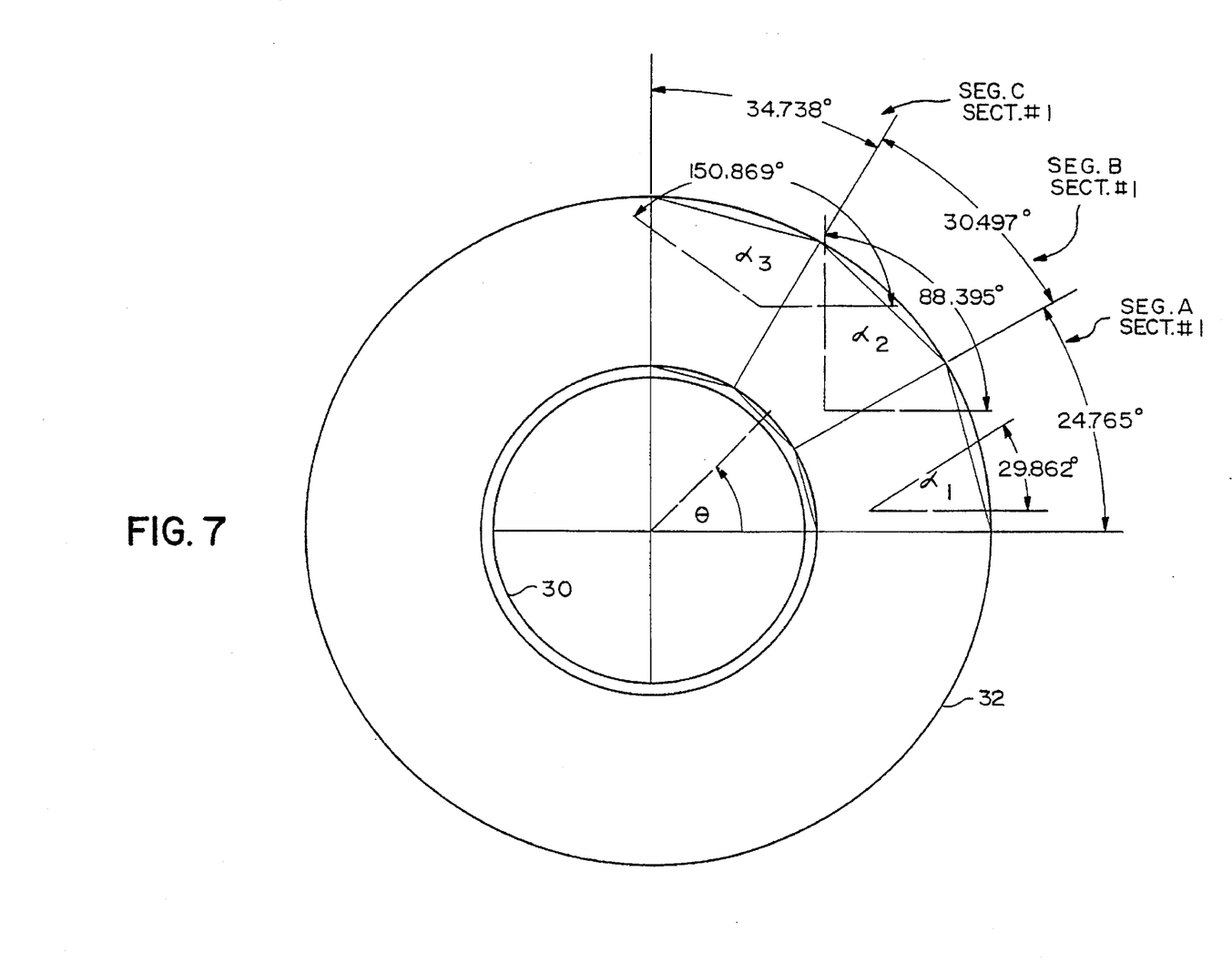
FIG. 7 is a diagram for the case of an elliptically shaped magnet section producing a dipole field pattern in accordance with the invention, the diagram showing angulation of the bricks of various ones of the segments of FIG. 5.

FIG. 7 shows the orientations of the magnetization vectors depicted in FIG. 9 for the segments A, B, and C. The angular location of the center of a magnet segment is given by $\Theta$. The orientation of the magnetic field (or magnetization) vector is represented by the angle A with the subscripts 1, 2, and 3 representing the three segments A, B, and C, respectively. Also shown in FIG. 7 are the angular widths of the segments A, B, and C of the section #1.

By way of comparison of the invention with the prior art, in the prior art, the angular width of each segment of a circular section ring dipole is 30 degrees rather than the angular widths of 24.765, 30.497, and 34.738 degrees shown in FIG. 7 for the elliptical section of the invention.

Also, in the prior art, the magnetization vector orientation in a circular ring dipole magnet assembly is linearly related the angular location, namely, that A is double $\Theta$. In the invention, wherein a section of the magnet assembly is elliptical and produces a dipole magnetic field, the relationship between A and $\Theta$ is nonlinear, and the values of alpha are calculated to minimize the external field and to maximize the homogeneity of the field within the bore of the magnet assembly. By way of example with respect to the angles alpha 1, alpha 2, and alpha 3 of the magnetization vector orientation as shown in FIG. 7, these angles have values respectively of 29.862, 88.395, and 150.869 degrees for the inventive elliptical section of magnet assembly while, in the case of a circular section of magnet assembly, the corresponding angles would be 24.765, 80.027, and 145.262 degrees.

Figure 8:
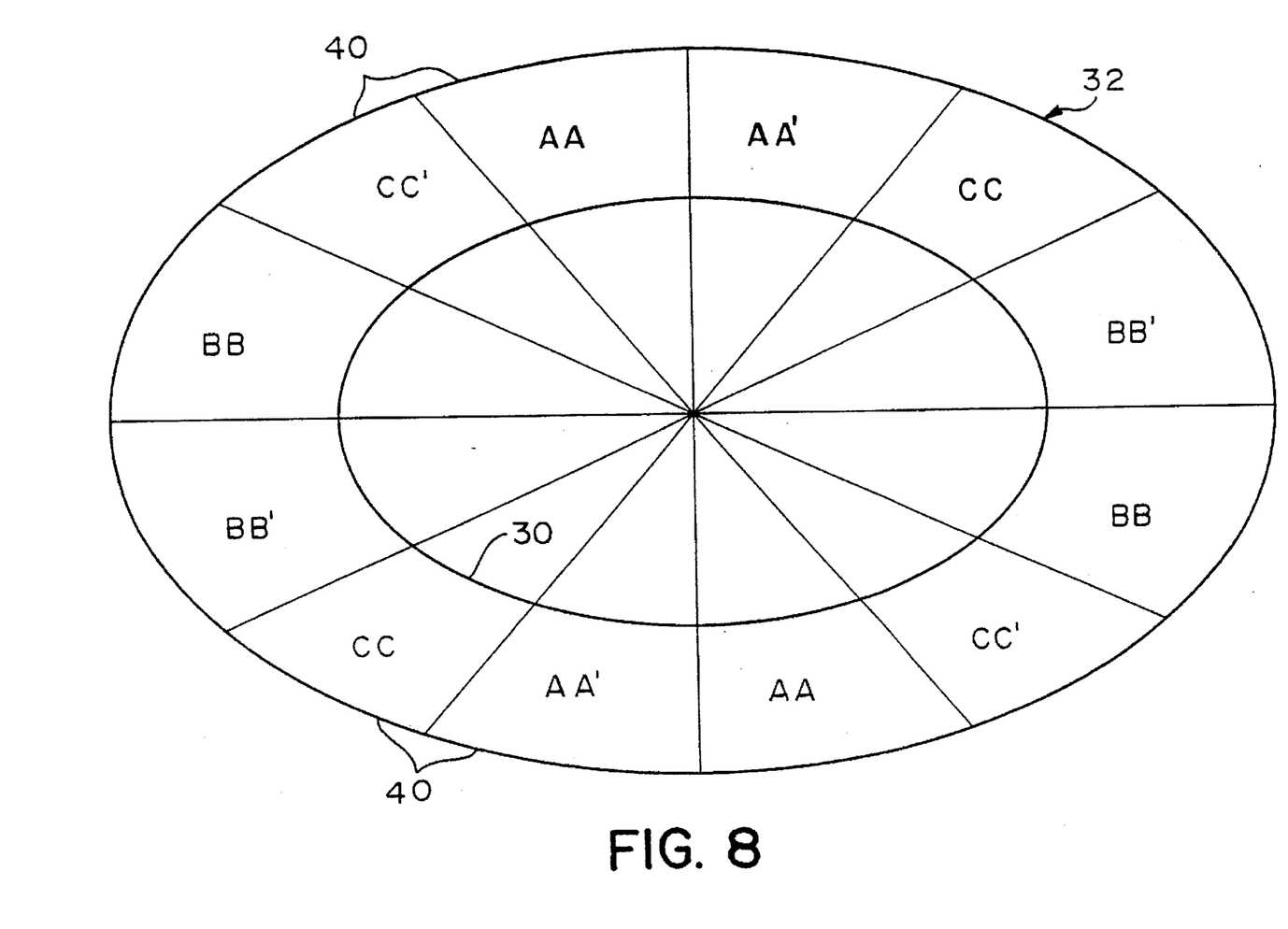
FIG. 8 is a diagram useful in explaining a pattern of symmetry among the configurations of the various segments of the magnet section of FIG. 5.

FIG. 8 is useful in describing the symmetry of construction of the section 32 depicted in FIG. 9. As has been mentioned hereinabove, various ones of the segments 40 have the same physical construction. Also, the directions of the magnetization vectors may be the same. This is depicted in the diagram of FIG. 8 wherein four of the segments designated by the legends AA and AA' all have the same physical configuration. and arrangement of the bricks 42, such arrangement of the bricks 42 having been disclosed in FIG. 5. In FIG. 8, the four segments identified by the legends BB and BB' have the same construction. Also, the four segments identified by the legends CC and CC' have the same construction.

Upon comparing FIG. 8 with FIG. 9, it is noted that the two segments AA correspond to the segments C and L of FIG. 9 wherein the magnetization vectors have the same direction within a segment. The segments AA' of FIG. 8 correspond to the segments D and K of FIG. 9 wherein the magnetization vectors are seen to have the same direction. The segments CC of FIG. 8 correspond to the segments B and M of FIG. 9. The segments CC' of FIG. 8 correspond to the segments E and H of FIG. 9. The segments BB of FIG. 8 correspond to the segments A and N of FIG. 9. The segments BB' of FIG. 8 correspond to the segments F. Furthermore, as may be observed by inspection of FIG. 9, the orientations of the arrangements of the bricks 42 of the segments AA and AA' are the mirror image of each other with reference to the horizontal or major axis 46 of FIG. 9. In similar fashion., the segments BB and BB' of FIG. 8 have arrangements of the bricks 42 which are the mirror image of each other as reflected about the vertical or minor axis 48 of FIG. 9. With respect to the arrangements of the bricks 42 in the four segments CC and CC' of FIG. 8, it is noted that there is a mirror image of the brick arrangements as found by reflection about the vertical axis 46 as well as about the horizontal axis 48. The foregoing symmetry provides for an advantage in the elimination of odd harmonics in the magnetic field.

With reference to FIGS. 9–13, there are shown further details in the construction of respective ones of the elliptical sections 32 as set forth in FIG. 4. The outline of each of the segments 40 of section #1 is shown in FIG. 9, the outline corresponding to the perimeter of the respective segment 40 as depicted in FIG. 5. Also shown in FIG. 9 is the frame 38 for holding the segments 40 in their respective positions. By way of example, the frame 38 may be constructed of a nonmagnetic material such as fiberglass. FIGS. 10–13 show construction of the sections 32, #2, #3, #4, and #5, respectively, these sections being identified in FIG. 4. Upon comparison of the structures of FIGS. 10–13 with FIG. 9, it is observed that each of the sections 32 have the same number and arrangement of the segments 40. However, the construction of the respective segments 40 in each of the sections 32 differ from one section 32 to another of the sections 32. For example, the perimeters of the respective segments 40 are seen to differ by inspection of these FIGS. The arrangements of the bricks 42 in the segments 40 of the respective ones of the sections 32 have been generated to provide the desired dipole field within the core 30, and with the desired homogeneity of field, while reducing the intensity of the magnetic field outside the housing 22 or a negligibly small value. In the construction of the preferred embodiment of the invention, it has been found that adequate control of the magnetic field has been attained without differentiating between the structures of the outboard sections #4 and #5, and, accordingly, these two output sections are constructed with equal configurations of their respective segments 40.

By way of alternative embodiments of the invention, it is noted that, if desired, each, of the sections 32 may be formed of more than twelve segments, if desired. This would provide for additional control of the magnetic field but is disadvantageous because of the added complexity and cost. Also, there is the disadvantage that the additional segments would provide further empty space in a section 32 between the segments. In addition, magnetization orientation could change from ring to ring. Furthermore, if desired, the total number of segments per section could be reduced, for example, to ten segments by way of example, with a reduction in the amount of empty space within a section 32. However, this would allow for less control of the configuration and intensity of the magnetic field. The twelve segments employed in the preferred embodiment of the invention appear to represent an optimum compromise.

Construction of the assembly 24 is aided by a computer simulation, as by using linear programming techniques or least square techniques whereby the configurations of the various segments is optimized. By way of example, the least square technique provides for a constrained minimization whereby the main field and homogeneity are formulated as constraints, and the volume of material is minimized. In the programming, by inserting the unit size of a brick, and by calculation of a particular magnetic field orientation and segment size, as well as a resulting field strength, the computer determines which spaces in a segment should be filled with the magnetic material and which spaces of a segment are to be void. The design of the magnet assembly 24 provides for a greater amount of filling of the segments with magnetic material in the outboard sections than in the inner sections. This may be observed by inspection of the FIGS. 9–13 wherein the sections #2–#5 have more magnet material than the inner sections #1. It is noted also that the mode of construction employed herein may be used for ellipses of different ellipticities including also the situation wherein the major and the minor axes are equal, namely, in the case of a circular core. The foregoing design procedure may be used for a bore having an irregular shape as well as a regular shape such as a circle or ellipse.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. In a magnet assembly having a central bore, the assembly comprising a plurality of sections encircling the bore and being disposed along an axis of the bore, the improvement wherein an individual one of said sections comprises:

a plurality of segments each of which includes a plurality of bricks of magnetic material;

wherein, in any one of said segments, each of said bricks is parallel to a common plane which is parallel to said axis, the bricks being magnetized with magnetic fields oriented in a common direction perpendicular to said plane to provide a direction of magnetization to said one segment;

wherein each of the bricks in any one of said segments has the shape of a parallelepiped, and each of the bricks in any one of said segments and distant from said bore, is selected from a class of brick sizes having a common length extending parallel to said bore axis and a common height extending transversely of said common direction of the magnetic fields, said brick sizes differing in width extending perpendicular to said length and height; and wherein the direction of magnetization of a first of said segments differs from the direction of magnetization of a second of said segments adjacent said first segment and located in a common one of said sections with said first segment to attain homogeneity of magnetic fields in said bore.

2. An assembly according to claim 1 wherein, in any one of said segments, a plurality of individual ones of said bricks which faces said bore is truncated in the dimension of length to have a length different from the values of length found in said class of brick sizes.

3. An assembly according to claim 1 wherein, each of said sections is elliptical to provide, as viewed in a transverse plane of said bore, an elliptical cross section to said bore suitable for reception of a patient in a magnetic resonance imaging system.

4. An assembly according to claim 3 wherein each of said sections consists of 12 of said segments, the cross-section of said bore is characterized by a major axis at a location of maximum diametric extent of said bore and a minor axis at a location of minimum diametric extent of said bore, said major axis being perpendicular to said minor axis and intersecting said minor axis at a central point;

wherein, in any one of said sections, there are four quadrants defined by said major and said minor axes with three of said segments lying in each of said quadrants, the configuration of one of said segments being the same as the configuration of another of said segments diametrically opposite said one segment to provide symmetry to an arrangement of said segments about said central point, there being further symmetry in configuration of the segments of a section about each of said axes.

5. An assembly according to claim 4 wherein, said plurality of magnetic sections provides a dipole form of magnetic field distribution within said bore.

6. An assembly according to claim 5 wherein, in each of said quadrants, a second of said segments lying between said central segment and said minor axis has a direction of magnetization which is generally transverse to a radius vector extending from said central point.

7. An assembly according to claim 6 wherein, in each of said quadrants, a third of said segments lying between said central segment and said major axis has a direction of magnetization generally parallel to the radius vector for minimization of a magnetic field disposed outside of said assembly.

8. An assembly according to claim 7 wherein there is an even number of said sections disposed about a central plane oriented normally to said bore axis.

9. An assembly according to claim 8 wherein there are five of said sections one side of said central plane and a further five of said sections on an opposite side of said central plane, an arrangement of these segments of the respective sections on said one side of said central plane being symmetric to an arrangement of the segments of the respective sections on said opposite side of said central plane.

10. An assembly according to claim 8 wherein, with respect to a set of said sections disposed on one side of said central plane, a first one of said sections lies adjacent said central plane and each of said sections has a first group of said segments disposed on a first side of said minor axis and a second group of said segments disposed on a second side of said minor axis;

wherein, for said first group of segments, senses of magnetization vectors in said first section are the same as senses of magnetization vectors in said other sections of said set of sections; and wherein, for said second group of segments, senses of magnetization vectors in said first section are reversed from senses of magnetization vectors of corresponding segments of said other sections of said set.

11. An assembly according to claim 1 wherein each of said bricks is magnetized as a permanent magnet.

12. An assembly according to claim 1 wherein said magnetic material is strontium ferrite, samarium cobalt, neodymium, boron, or iron.

13. An assembly according to claim 1 wherein voids are provided among a plurality of the bricks in any one of said segments.

14. An assembly according to claim 1 wherein substantially all of the bricks are of a standard unit size.

15. An assembly according to claim 1 wherein all of the bricks within a segment together provide an outer periphery which approximates but does not fully provide a trapezoidal configuration.

16. An assembly according to claim 1 wherein, in any one of said segments, a plurality of individual ones of said bricks which faces said bore is truncated in the dimension of width to have a width different from the values of width found in said classes of brick size.

17. An assembly according to claim 1 wherein said assembly is part of a magnetic resonance imaging system having gradient coils operative with said sections to produce a magnetic field, and an individual one of said segments comprises material, including said magnetic material, which is substantially nonconductive to inhibit development of eddy currents induced from said gradient coils.

18. An assembly according to claim 1 wherein each of said sections is elliptical with a major axis and a minor axis, said magnet assembly producing a dipole field extending along said major axis.

19. A magnet assembly for a magnetic resonance imaging system having an imaging volume for imaging of biological tissue, the magnet assembly enclosing said volume for generating a magnetic field within the volume, said magnet assembly comprising:

a plurality of elliptically-shaped dipole magnet sections arranged for encircling said volume;

wherein each of said magnet sections comprises a plurality of standardized parallelepiped bricks of magnetic material arranged in segments having individual directions of magnetization, a magnetization direction of at least one of said segments differing from a magnetization direction of at least one other of said segments to produce a dipole magnetic field within said volume.

* * * * *